United States Patent
McEwan (10) Patent No.: US 7,333,330 B2
(45) Date of Patent: Feb. 19, 2008

(54) ELECTRONIC COMPONENT CHASSIS WITH ISOLATED POWER SUPPLY COOLING

(75) Inventor: John Arthur McEwan, Dulles, VA (US)

(73) Assignee: Technology Advanced Group, Inc., Dulles, VA (US)

( * ) Notice: Subject to any disclaimer, the term of this patent is extended or adjusted under 35 U.S.C. 154(b) by 246 days.

(21) Appl. No.: 11/049,672

(22) Filed: Feb. 4, 2005

(65) Prior Publication Data

US 2006/0176663 A1    Aug. 10, 2006

(51) Int. Cl.
  *G06F 1/20* (2006.01)
(52) U.S. Cl. ..................... 361/687; 361/685
(58) Field of Classification Search ............... 361/687, 361/685
  See application file for complete search history.

(56) References Cited

U.S. PATENT DOCUMENTS

| | | | |
|---|---|---|---|
| 4,782,160 A | 11/1988 | Fujikura et al. | |
| 5,432,674 A | 7/1995 | Hardt | |
| 5,440,450 A | 8/1995 | Lau et al. | |
| 5,485,350 A * | 1/1996 | Hecht et al. | 361/692 |
| 5,493,457 A * | 2/1996 | Kawamura et al. | 720/648 |
| 5,860,291 A * | 1/1999 | Johnson et al. | 62/259.2 |
| 5,926,367 A | 7/1999 | Gutierrez et al. | |
| 5,969,938 A | 10/1999 | Byrne et al. | |
| 6,034,870 A | 3/2000 | Osborn et al. | |
| 6,094,345 A | 7/2000 | Diemunsch | |

* cited by examiner

*Primary Examiner*—Lisa Lea-Edmonds
*Assistant Examiner*—Ingrid Wright
(74) *Attorney, Agent, or Firm*—Nixon Peabody LLP; David L. May (57) ABSTRACT

An electronics chassis, such as a computer chassis including various active electronic components having various heat dissipation rates and operating tolerances. A power supply and various components are housed in an enclosure. A component cooling system causes a first fluid to flow through an area surrounding the electronic components to cool the electronic components through convection. A power supply cooling system causes a second fluid to flow through an area surrounding the power supply to cool the power supply through convection by drawing fluid from an area external of said enclosure and exhausting fluid to an area external of said enclosure. The second fluid is isolated from the first fluid within the enclosure.

38 Claims, 6 Drawing Sheets

ELECTRONIC COMPONENT CHASSIS WITH ISOLATED POWER SUPPLY COOLING

BACKGROUND OF THE INVENTION

1. Field of the Invention

The invention relates generally to electronic component chassis and more specifically to a chassis for electronic components, such as a computer chassis, in which a power supply has a cooling system which is isolated from other components.

2. Description of the Related Art

It is well known to house various electronic components in an enclosure. In many instances, a power supply for providing operating voltage and current to the components is also housed in the enclosure. The phrase "power supply" as used herein, refers generally to a device having a primary purpose of generating and/or regulating electric operating power supplied to active electronic components. All electronic components other than power supplies are referred to merely as "components" herein. Typically, all electronic components dissipate heat to some degree. Further, power supplies by nature dissipate a relatively large amount of heat as compared to components.

One example of electronic components housed with a power supply is a computer chassis. Typically, a computer chassis includes a power supply housed in the same enclosure as various computer components, such as motherboards having central processing units (CPUs), memory devices, communication interface devices, and the like. The phrase "computer component" as used herein, refers to any component that is housed in an enclosure of a computer chassis, except for the power supply.

As computers become more ubiquitous in society, it becomes more desirable to reduce the size of computer chassis. Currently, there is a clear trend toward more powerful and more compact computer chassis. Accordingly, the consumed power per unit density, i.e. the power density, of the average computer has increased tremendously over the past several years. However, such an increase in power density runs into a limitation of heat dissipation. More specifically, the higher the power density, the more heat generated and the more difficult it is to dissipate the heat. Of course, heat adversely affects the operation of most microprocessor based components and other components. Accordingly, the desire to reduce the size and increase the power of computers is at odds with the need to maintain components at temperatures within desired operating ranges. Further, the presence of a power supply in the same enclosure as computer components can adversely effect the operation of the computer components because of the large amount of heat dissipated by the power supply and the generally disparate heat rates and characteristics of power supplies as compared to computer components.

Essentially, there are two processes by which heat in a computer enclosure is dissipated. The first process is fluid exchange cooling which consists of replacing a heated fluid, such as air, in the enclosure with a cooler fluid, e.g. ambient air. The second process is forced cooling in which the fluid is moved across the surface of a specific component to raise the convective heat transfer coefficient for the surface of the component thereby cooling the component faster than if the component was in static fluid. Most computer enclosures incorporate both heat dissipation processes to some degree. Both processes require the movement of air.

It is well known to use fans or blowers to move air through computer enclosures to cool various components therein. Conventionally, such devices are placed in a front panel or a back panel of the computer enclosure. However, the presence of a power supply serves to create excess heat in the enclosure that tends to raise the operating temperature of other components in the enclosure. Accordingly, conventional computer chassis include a relatively large fan that is sized for the entire heat producing system, i.e. the power supply and the computer components in the chassis. The large fan wastes precious enclosure and panel space. Further, fans themselves generate heat and thus oversized fan generates excessive heat.

It is known to take advantage of various ducts in computer chassis. For example, U.S. Pat. No. 6,094,345 discloses a computer enclosure having a duct that extends between external portions of the enclosure and includes an air intake that is open to internal portions of the enclosure. Air is drawn into an external intake and the internal intake for cooling the power supply. The air drawn in the internal intake has been heated by other components in the enclosure.

U.S. Pat. No. 5,432,674 discloses a computer enclosure having a duct extending between the front and back panels of the enclosure. A fan forces air through the duct to cool a power supply. The duct includes an exhaust opening into an interior of the enclosure for cooling other components. Accordingly, the air used to cool the components has been heated by the power supply.

SUMMARY OF THE INVENTION

It is an object of the invention to enhance cooling effects of electronic components.

A first aspect of the invention is an electronics chassis including various active electronic components having various heat dissipation rates and operating tolerances. The chassis comprises an enclosure, a power supply housed in the enclosure, and at least one electronic component housed in the enclosure. An electronic component cooling system cools the electronic components. A power supply cooling system causes a fluid, such as air, to flow through an area surrounding the power supply to cool the power supply through convection by drawing fluid from an area external of the enclosure and exhausting fluid to an area external of the enclosure. The fluid is isolated from the components within the enclosure.

A second aspect of the invention is a computer chassis comprising an enclosure, a power supply housed in the enclosure, and at least one computer component housed in the enclosure. A computer component cooling system cools the computer components. A power supply cooling system causes a fluid to flow through an area surrounding the power supply to cool the power supply through convection by drawing fluid from an area external of the enclosure and exhausting fluid to an area external of the enclosure. The fluid is isolated from the computer components within the enclosure.

BRIEF DESCRIPTION OF THE DRAWINGS

The invention will be described through a preferred embodiment and the attached drawings in which.

DETAILED DESCRIPTION OF THE PREFERRED EMBODIMENTS

In conventional computer chassis, the power supply fan typically exhausts directly to ambient, air that has already been heated by the computer components prior to being used to cool the power supply. Since this air came from around the computer components, it was heated above ambient prior to being used to cool the power supply. Therefore, the power supply fan must be capable of moving a large amount of air quickly since the heated air is not as effective for cooling as ambient air would be. In other words, known cooling techniques use a serial arrangement of cooling first the computer components with ambient air and then the power supply with the heated air that was used to cool the components. The invention uses a "parallel" technique for cooling both the components and the power supply with ambient air. Accordingly, the invention permits the cooling system to be separately optimized for both the power supply and the components. The particular temperature limits, heat generation, required air flow rates, geometries, space constraints, and other characteristics of the components and power supply are very different. Therefore, separate optimization yields a much more efficient cooling system.

Figure 1:
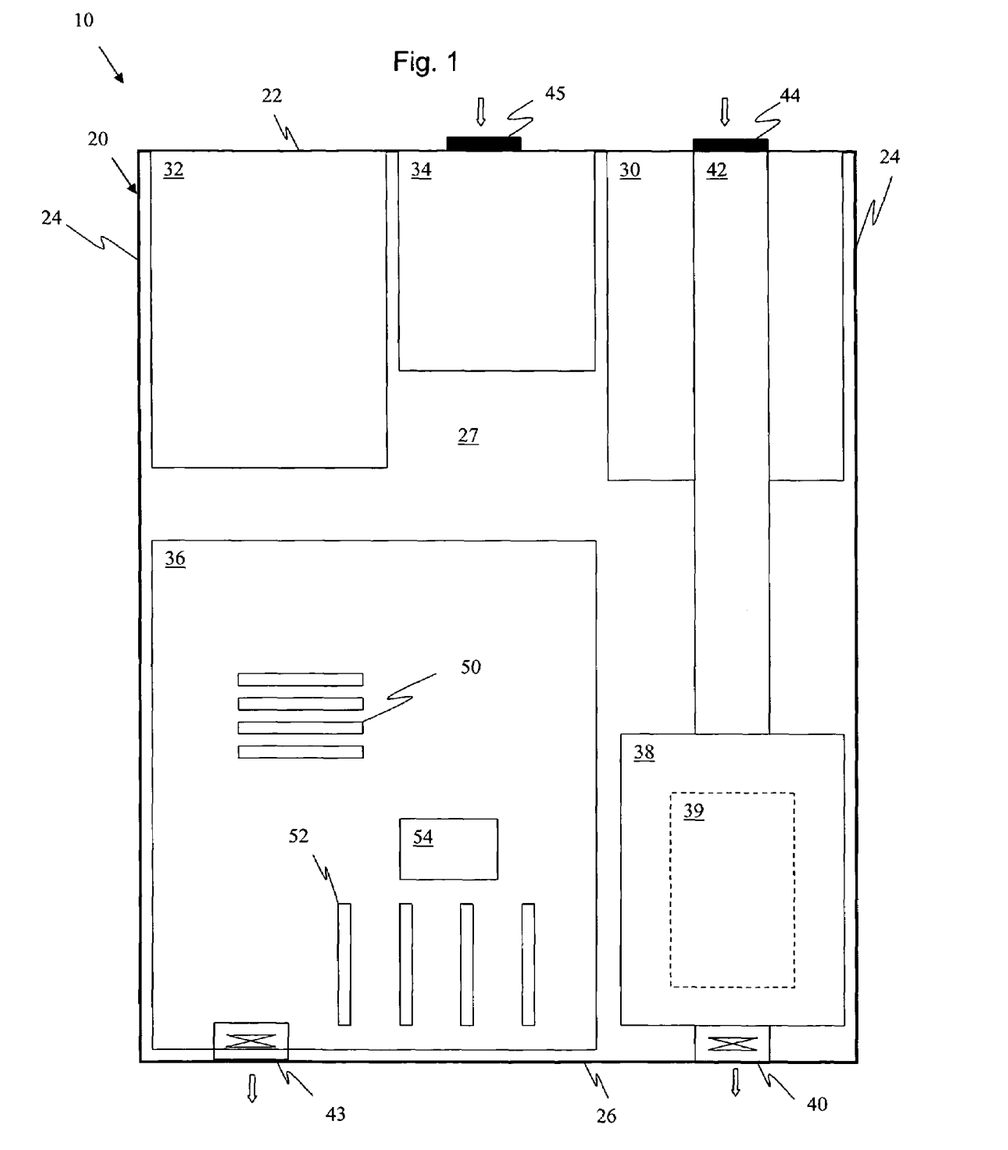
FIG. 1 is a top view of a chassis of the first preferred embodiment with a top panel removed.
Figure 2:
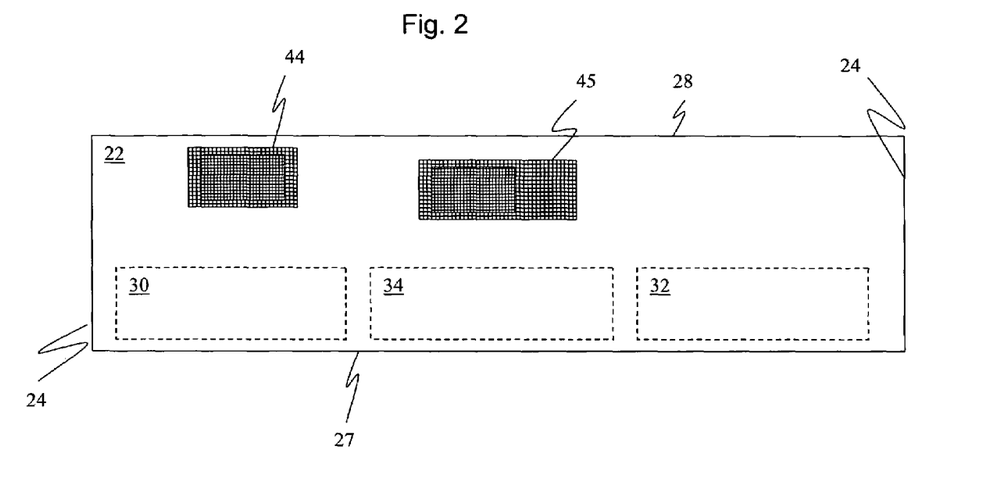
FIG. 2 is a front view of the chassis of FIG. 1.

FIGS. 1 and 2 illustrate a first preferred embodiment of the invention. The preferred embodiments discussed herein relate to a computer chassis. However, the invention can be applied to any type of chassis having any type of electronic components. Computer chassis 10 includes enclosure 20 component bays 30, 32, and 34, motherboard 36, and power supply 39. Power supply 39 is housed in power supply casing 38. Enclosure 20 of the preferred embodiment can be a standard rack mount enclosure, a desktop computer enclosure, a tower computer enclosure, or any other type of enclosure. As illustrated in FIGS. 1 and 2, enclosure 20 is constructed of front panel 22, side panels 24, back panel 26 bottom panel 27, and top panel 28.

Bays 30, 32, and 34 can house various devices such as DAT (digital audio tape) drives, hard drives, diskette drives, CD-ROM drives, DVD (digital video disk, drives, and the like. Motherboard 36 includes plural memory module slots 50 (for supporting SDRAM memory modules, EDO memory modules, SIMMS memory modules, DIMMS memory modules, or the like), expansion card slots 52 (PCI, ISA, EISA, AGP, or the like), processor 54 and various other components and connectors in a known manner. Power supply 39 can be a standard power supply, or a custom power supply of any type.

Fan assembly 40 is coupled to power supply casing 38 and includes a duct or other passage providing communication between power supply casing 38 and the exterior of enclosure 20 through an opening formed in back panel 26. Duct 42 is coupled to power supply casing 38, at a position substantially opposite fan assembly 40, and provides communication between power supply casing 38 and the exterior of enclosure 20 through an opening formed in front panel 22 and covered by grill assembly 44. Fan assembly 40, duct 42, and power supply casing 38 constitute a cooling means for power supply 39. More specifically, fan assembly 40 exhausts a first fluid, ambient air in the preferred embodiment, out of power supply casing 38, as indicated by the arrow. The air travels across power supply 39, thus cooling power supply 39 through convection, as the air is replaced in power supply 39 by ambient air drawn into power supply casing 38 through grill assembly 44 and duct 42. Alternatively, fan assembly 40 can be configured to blow air into power supply casing 38, which air is exhausted to ambient through grill assembly 44 and duct 42.

Significantly, the fluid used for cooling power supply 39 is isolated from other components within the enclosure 20. Accordingly, fan assembly 43 is provided in back panel 26 and includes a fan communicating with ambient through an opening in back panel 26 to exhaust air from enclosure 20 to ambient, as indicated by the arrow. Grill assembly 45 is provided over an opening in from panel 22 to permit a second fluid, also ambient air in the preferred embodiment, to be drawn into enclosure 20 by fan assembly 43 as fans assembly 43 exhausts air from enclosure 20 to ambient. Alternatively, fan assembly 43 can be configured to draw ambient air into enclosure 20 through grill assembly 45. Fan assembly 43 and grill assembly 45 therefore serve as means for cooling the components. Note once again that the means for cooling power supply 39 are isolated from other portions of the interior of enclosure 20. Therefore, the cooling means can be sized and tuned for power supply 39 to most efficiently cool power supply 39.

Figure 3:
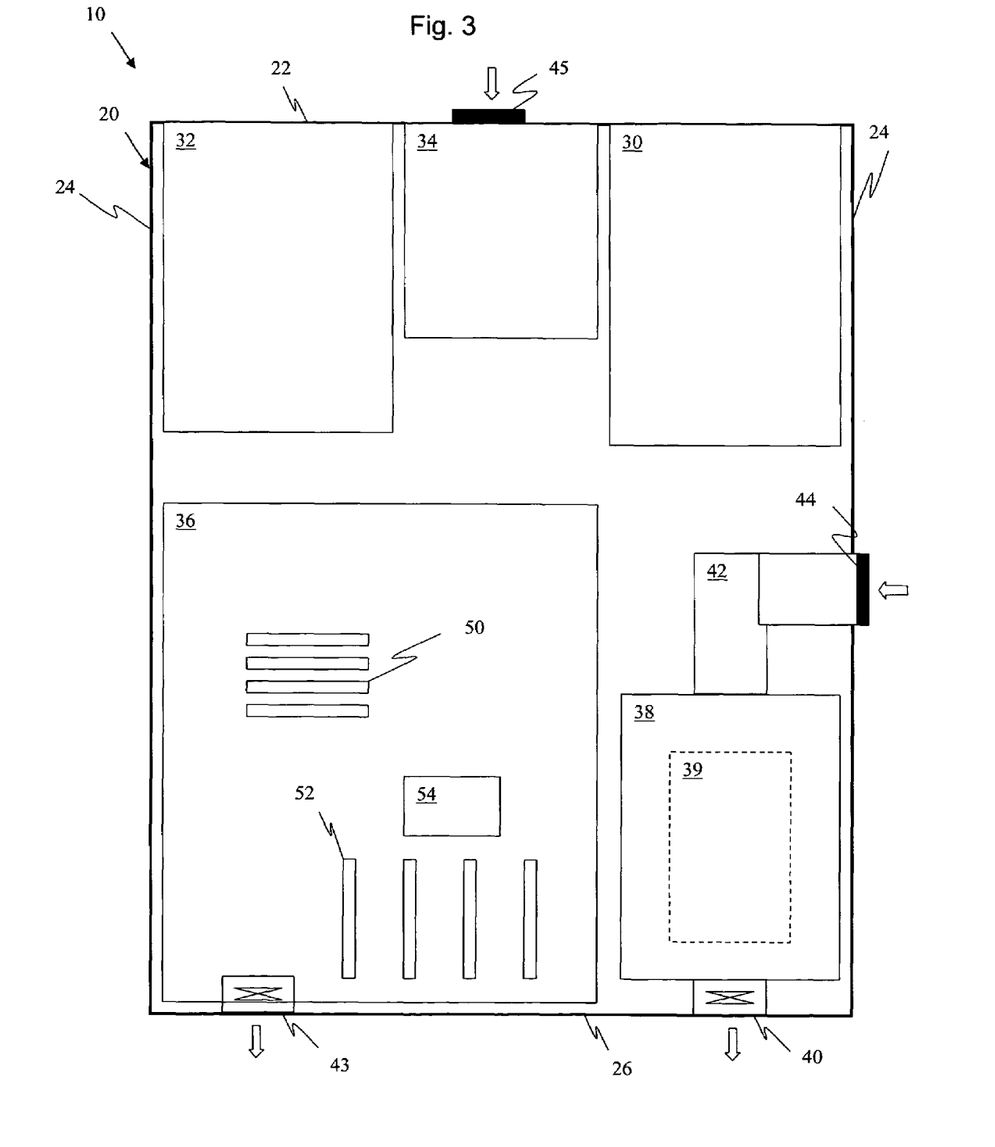
FIG. 3 is a top view of a chassis of the second preferred embodiment.

FIG. 3 illustrates a second embodiment that is similar to the first embodiment. However, in the second embodiment, duct 42 opens to grill assembly 44 in side panel 24. Once again, the cooling air for power supply 39 is isolated from cooling air for other components. Other aspects of the second embodiment are the same or similar to the first embodiment and the various features of the embodiments can be combined.

Figure 4:
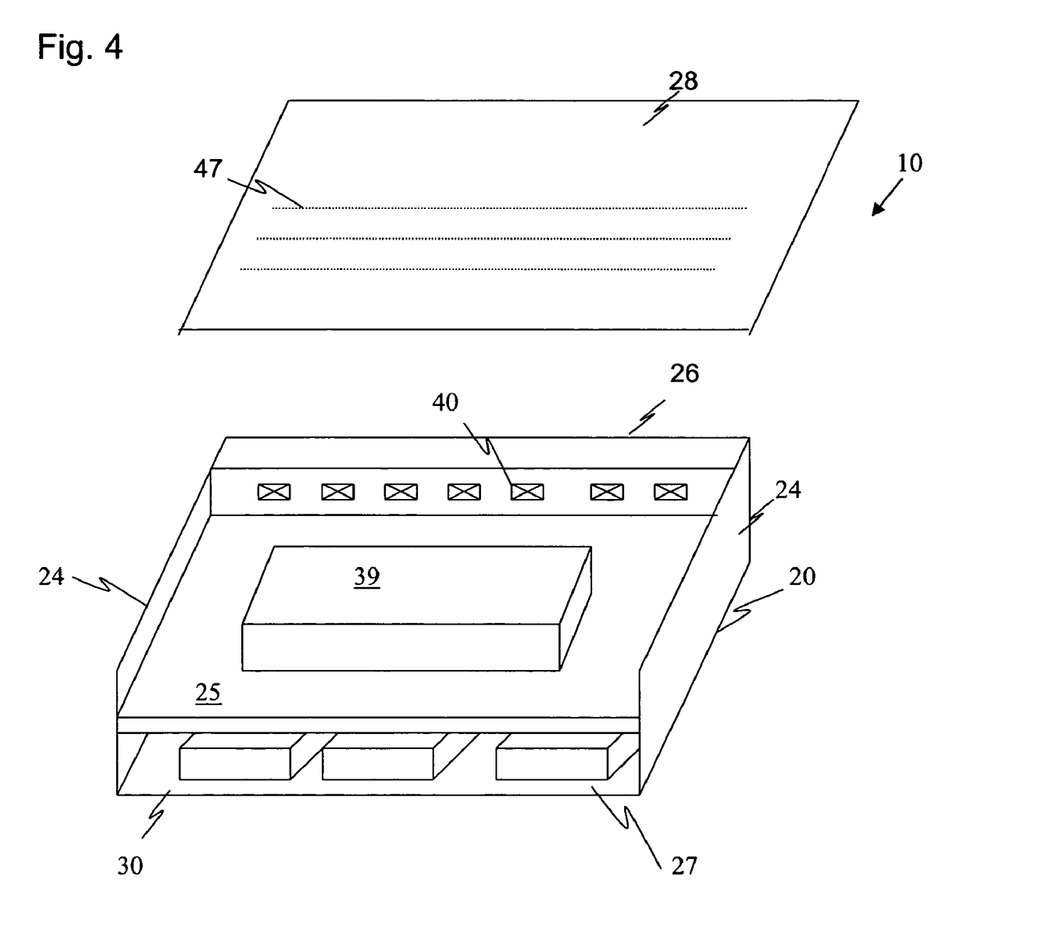
FIG. 4 is a partially exploded, perspective view of another preferred embodiment without a front panel.
Figure 5:
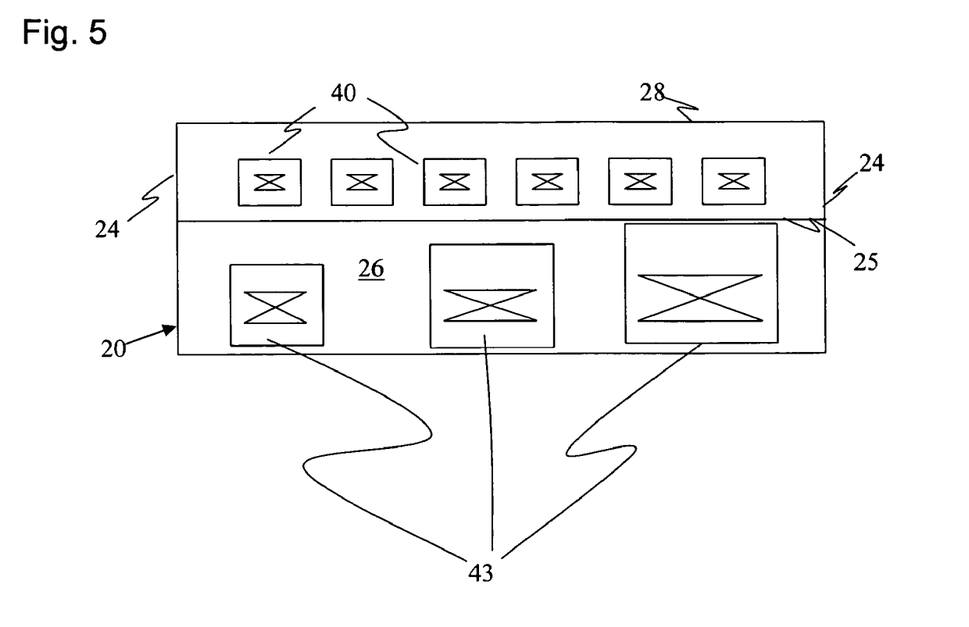
FIG. 5 is a back view of the chassis of FIG. 4 with the back panel removed for clarity of illustration.

FIG. 4 illustrates another embodiment of the chassis 10 of the present invention. Aspects of this embodiment are the same or similar to the above embodiments. As shown in FIG. 4, enclosure 20 is divided by a ledge panel 25. Power supply 39 rests upon ledge panel 25. Top panel 28 can include perforations 47. Referring to FIG. 5, a plurality of fan assemblies 40 for the cooling power supply are located at the back of enclosure 20 above ledge panel 25. When assembled in enclosure 20, power supply 39 is isolated from the other components via ledge 25, side panels 24 and front panel (not shown) and back panel 26. Fan assemblies 40, top panel 28 with perforations 47 and ledge 25 form cooling means for power supply 39. Fan assemblies 40 draw a first fluid, for example, ambient air, through perforations 47 and across power supply 39, cooling the same through convection. The air is exhausted from the enclosure via fan assemblies 40 through back panel 26. Although, not shown, fan assemblies 40 could be provided with grill assemblies, as in the other preferred embodiments. Also, as noted above, the flow of air can be reversed. Note that the position, size and number of perforations 47 can be configured to provide the desired flow of fluid across power supply 39.

The remaining devices are housed in bay 30 located below ledge panel. 25. Although one bay 30 is illustrated, the area could be separated into individual bays as well. Communicating with bay 30 are fan assemblies 43, the size and number of fan assemblies 43 being dependent upon the number of components housed within the enclosure. The components are cooled by a second fluid, also ambient air in the preferred embodiment. Openings in the front panel permit the second fluid to be drawn into bay 30 by fan assemblies 43 and exhausted from the back panel 26 via openings formed therein. The first and second cooling fluids are thus isolated. In a situation where plural chassis are stacked closely on top of one another, such as in a rack configuration, recessed portions can be defined in top panel 28 to permit air to flow freely into perforations 47.

Figure 6:
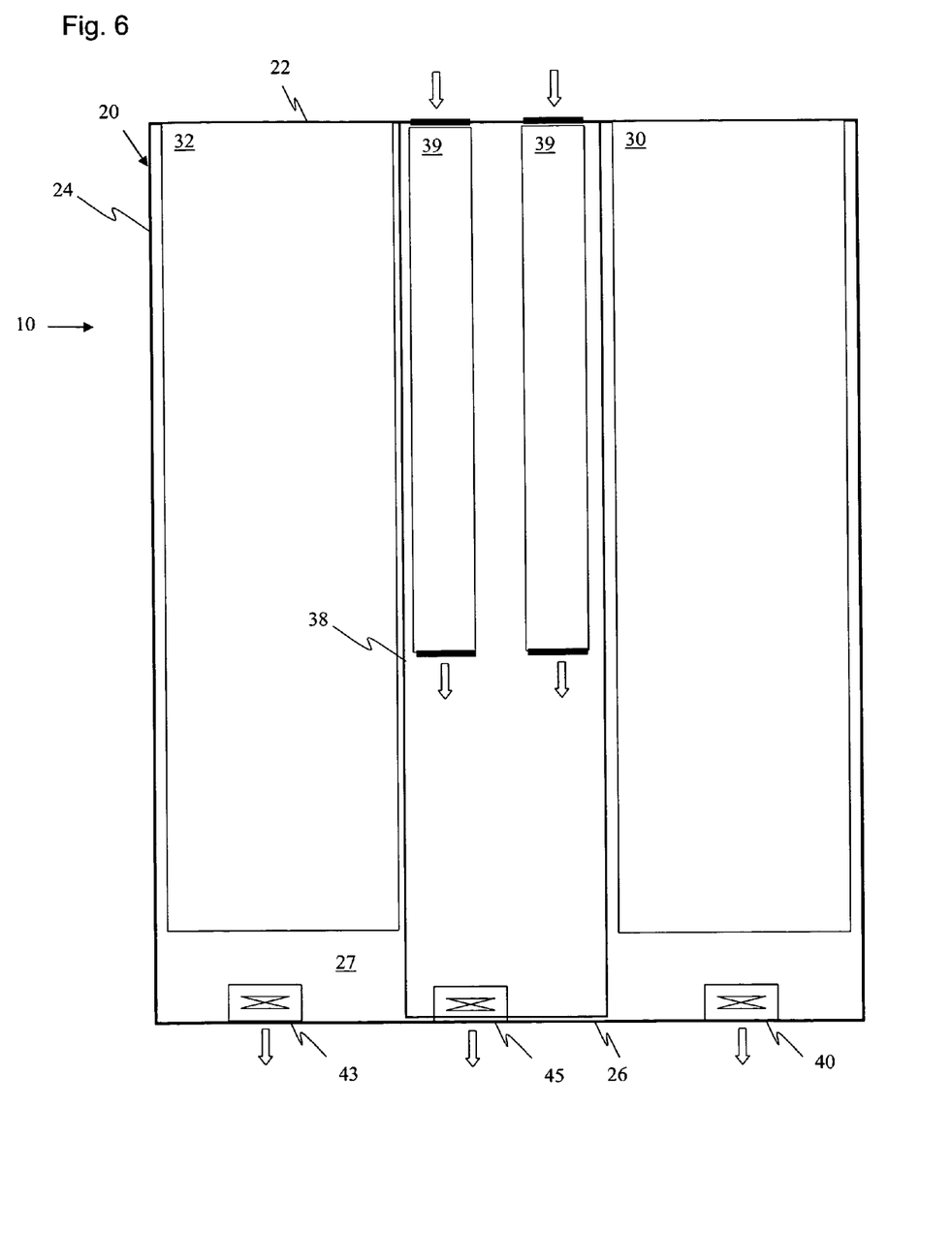
FIG. 6 is a top view of another preferred embodiment, with the top panel removed for clarity of illustration.

FIG. 6 illustrates another preferred embodiment of the invention. The embodiment of FIG. 6 is directed to a data storage device chassis, such as a chassis having additional hard drives to add storage to an existing network or computer device. Chassis 10 includes enclosure 20 component bays 30 and 32, containing hard drives or other memory components in this embodiment, and two power supplies 39. Power supplies 39 can be configured as redundant power supplies or each power supply 39 can power respective memory components. Power supplies 39 are disposed in power supply casing 38 which defines a channel through a central portion of enclosure 20. Enclosure 20 of the preferred embodiment can be a standard rack mount enclosure, or any other type of enclosure. Enclosure 20 is constructed of front panel 22, side panels 24, back panel 26 bottom panel 27, and a top panel (not shown in FIG. 6).

Fan assembly 45 is coupled to power supply casing 38 and includes a duct or other passage providing communication between power supply casing 38 and the exterior of enclosure 20 through an opening formed in back panel 26. Fan assembly 45 and power supply casing 38 constitute a cooling means for power supplies 39. More specifically, fan assembly 45 exhausts a first fluid, ambient air in the preferred embodiment, out of power supply casing 38. The air travels across power supplies 39, thus cooling power supplies 39 through convection, and the air is exhausted to ambient space out of a grill assembly or other opening in back panel 26. Of course, as noted above, appropriate openings can be formed in enclosure 20 and power supply casing 38 to permit ambient air, from outside of enclosure 20 to replace the air exhausted from power supply casing 38. Alternatively, fan assembly 45 can be configured to blow air into power supply casing 38, which air is exhausted from power supply casing 38 through an appropriate opening in enclosure 20.

Significantly, the fluid used for cooling power supply 39 is isolated from other components within the enclosure 20. Accordingly, fan assembly 43 is provided in back panel 26 and includes a fan communicating with ambient through an opening in back panel 26. A grill assembly or other opening is provided in from panel 22 to permit a second fluid, also ambient air in this embodiment, to be drawn into enclosure 20 by fan assembly 43 as fan assembly 43 exhausts air through an opening in back panel 26. Alternatively, fan assembly 43 can be configured to blow air into enclosure 20. Fan assembly 43 therefore serve as means for cooling the memory components in bay 32. Similarly, fan assembly 40 and appropriate openings in casing 20 can be provided to form a means for cooling the memory components in bay 30. Note once again that the means for cooling power supplies 39 are isolated from other portions of the interior of enclosure 20. In other words, there is not substantial mixing, within enclosure 20, of the fluid for cooling the power supplies and the fluid for cooling the memory components.

The invention can be applied to any type of electronic chassis, such as personal computers, servers, storage devices, audio/video devices, communications equipment, instrumentation, and the like. The power supply cooling means of the preferred embodiments includes fans, blowers, ducts and other passages. However, power supply the cooling means can take any form that moves fluid across the power supply to provide convective cooling. For example, the power supply cooling means can include blowers, pumps, solid state electronic motive devices, thermal devices which cause fluid motion through a temperature gradient, or the like. The intake and exhaust of the power supply cooling means can be at any position as long as such positions do not frustrate the substantial isolation between the various cooling means. Of course, it is impractical to hermetically seal components. Therefore, the term "isolated" as used herein refers to substantial isolation, but not necessarily complete isolation, which prevents substantial mixing between the various flows of cooling fluid. The fan assembly, or other device for moving cooling fluid, can be placed at any position, such as in a power supply housing, in a duct or other passage, external of these elements, inside the enclosure or external of the enclosure. Any combination of ducts, hoses, passages, baffles, devices for moving fluid, and other elements can be used to construct the power supply cooling means. The fluid used for cooling can be any fluid, such as ambient air, any other gas, liquids, or the like.

It can be seen that isolation of the cooling means used for the power supply from cooling means used for other components permits the power supply cooling means to be designed and tuned for the heat dissipation characteristics of the power supply. Since these characteristics are significantly different from that of other components, the cooling system can be optimized. While the fluid flow paths for the cooling means are isolated, the same type of fluid can serve as the fluid flowing through each cooling means. For example, in the preferred embodiment, the first and second fluid are both ambient air. The isolated power supply cooling means may eliminate the need for forced convection cooling of other components. Therefore, the component cooling means may merely be accomplished through conduction and/or natural convection. It is often desirable to operate both cooling systems in a manner in which the exhaust of each system is remote from the intake of the systems to avoid recirculation of heated air into the enclosure.

The invention can have any components in any configuration. For example, various power supplies, drives, motherboards switches and memory devices can be used. The invention can be used in any size of equipment requiring cooling. The enclosure can be rack mounted or free standing. The invention can include one or more power supplies having a common cooling means or separate cooling means.

While the foregoing description includes many details and specificities, it is to be understood that these have been included for purposes of explanation only, and are not to be interpreted as limitations of the present invention. Many modifications to the embodiments described above can be made without departing from the scope of the invention, as set forth in the following claims and their legal equivalents.

What is claimed is:

1. A chassis including various components having various heat dissipation rates and operating tolerances, said chassis comprising:

an enclosure;

a power supply housed in said enclosure;

at least one component housed in said enclosure;

component cooling means for cooling said components; and power supply cooling means for causing a first fluid to flow through an area surrounding said power supply to cool said power supply through convection by drawing fluid from an area external of said enclosure and exhausting fluid to an area external of said enclosure, said power supply cooling means isolating said first fluid from said electronic component within said enclosure, wherein said at least one component is an electronic component, wherein said component cooling means comprises means for causing a second fluid to flow through an area surrounding said electronic components to cool said electronic components through convection, wherein said power supply cooling means comprises a power supply housing surrounding said power supply and disposed in said enclosure, a first duct coupling an interior of said power supply housing with a first opening defined in said enclosure, a second duct coupling an interior of said power supply housing with a second opening defined in said enclosure, and means for moving the first fluid through said power supply housing.

2. A chassis as recited in claim 1, wherein said means for moving is a fan.

3. A chassis as recited in claim 1, wherein said means for moving is a blower.

4. A chassis as recited in claim 1, wherein said first opening is defined in a rear panel of said enclosure and said second opening is defined in a front panel of said enclosure.

5. A chassis as recited in claim 1, wherein at least one of said first opening and said second opening is defined in a side panel of said enclosure.

6. A chassis as recited in claim 1, wherein at least one of said first opening and said second opening is defined in a top panel of said enclosure.

7. A chassis as recited in claim 1, wherein at least one of said first opening and said second opening is defined in a bottom panel of said enclosure.

8. A chassis as recited in claim 1, wherein said electronic components comprise at least one of a computer mother board, a computer memory device, and a computer communications interface device.

9. A computer chassis comprising:
an enclosure;
a power supply housed in said enclosure;
at least one computer component housed in said enclosure;
computer component cooling means for cooling said computer components;
power supply cooling means for causing a first fluid to flow through an area surrounding said power supply to cool said power supply through convection by drawing fluid from an area external of said enclosure and exhausting fluid to an area external of said enclosure, said power supply cooling means isolates said first fluid from said computer components within said enclosure, wherein said computer component cooling means comprises mean for causing a second fluid to flow through an area surrounding said computer components to cool said computer components through convection, wherein said power supply cooling means comprises a power supply housing surrounding said power supply and disposed in said enclosure, a first duct coupling an interior of said power supply housing with a first opening defined in said enclosure, a second duct coupling an interior of said power supply housing with a second opening defined in said enclosure, and means for moving the first fluid through said power supply housing.

10. A chassis as recited in claim 9, wherein said means for moving is a fan.

11. A chassis as recited in claim 9, wherein said means for moving is a blower.

12. A chassis including various components having various heat dissipation rates and operating tolerances, said chassis comprising:
an enclosure;
a power supply housed in said enclosure;
at least one component housed in said enclosure;
component cooling means for cooling said components; and
power supply cooling means for causing a first fluid to flow through an area surrounding said power supply to cool said power supply through convection by drawing fluid from an area external of said enclosure and exhausting fluid to an area external of said enclosure, said power supply cooling means isolating said first fluid from said electronic component within said enclosure, wherein said power supply cooling means comprises a power supply housing surrounding said power supply and disposed in said enclosure, a first duct coupling an interior of said power supply housing with a first opening defined in said enclosure, a second duct coupling an interior of said power supply housing with a second opening defined in said enclosure, and means for moving the first fluid through said power supply housing.

13. A chassis as recited in claim 12, wherein said at least one component is an electronic component.

14. A chassis as recited in claim 13, wherein said electronic component is an active electronic component.

15. A chassis as recited in claim 13, wherein said component cooling means comprises means for causing a second fluid to flow through an area surrounding said electronic components to cool said electronic components through convection.

16. A chassis as recited in claim 12, wherein said means for moving is a fan.

17. A chassis as recited in claim 12, wherein said means for moving is a blower.

18. A chassis as recited in claim 12, wherein said first opening is defined in a rear panel of said enclosure and said second opening is defined in a front panel of said enclosure.

19. A chassis as recited in claim 12, wherein at least one of said first opening and said second opening is defined in a side panel of said enclosure.

20. A chassis as recited in claim 12, wherein at least one of said first opening and said second opening is defined in a top panel of said enclosure.

21. A chassis as recited in claim 12, wherein at least one of said first opening and said second opening is defined in a bottom panel of said enclosure.

22. A chassis as recited in claim 12, wherein said electronic components comprise at least one of a computer mother board, a computer memory device, and a computer communications interface device.

23. A chassis as recited in claim 15, further comprising a ledge disposed in said enclosure for supporting said power supply and separating the power supply from the said at least one component.

24. A chassis as recited in claim 23, wherein said power supply cooling means comprises a power supply housing defined by said ledge and enclosure, a first and second opening defined in said enclosure, and means for moving a first fluid through said power supply housing.

25. A chassis as recited in claim 24, where said means for moving comprises a plurality of fans.

26. A chassis as recited in claim 24, wherein said first opening comprises defined by a plurality of perforations in a top panel of said enclosure and said second opening is defined in a rear panel of said enclosure.

27. A computer chassis comprising:
an enclosure;
a power supply housed in said enclosure;
at least one computer component housed in said enclosure;
computer component cooling means for cooling said computer components;

power supply cooling means for causing a first fluid to flow through an area surrounding said power supply to cool said power supply through convection by drawing fluid from an area external of said enclosure and exhausting fluid to an area external of said enclosure, said power supply cooling means isolates said first fluid from said computer components within said enclosure, wherein said power supply cooling means comprises a power supply housing surrounding said power supply and disposed in said enclosure, a first duct coupling an interior of said power supply housing with a first opening defined in said enclosure, a second duct coupling an interior of said power supply housing with a second opening defined in said enclosure, and means for moving the first fluid through said power supply housing.

28. A chassis as recited in claim 27, wherein said computer component cooling means comprises mean for causing a second fluid to flow through an area surrounding said computer components to cool said computer components through convection.

29. A chassis as recited in claim 27, wherein said means for moving is a fan.

30. A chassis as recited in claim 27, wherein said means for moving is a blower.

31. A chassis as recited in claim 27, wherein at least one of said first opening and said second opening is defined in a side panel of said enclosure.

32. A chassis as recited in claim 27, wherein at least one of said first opening and said second opening is defined in a top panel of said enclosure.

33. A chassis as recited in claim 27, wherein at least one of said first opening and said second opening is defined in a bottom panel of said enclosure.

34. A chassis as recited in claim 28, further comprising a ledge disposed in said enclosure for supporting said power supply and separating the power supply from the said at least one computer component.

35. A chassis as recited in claim 33, wherein said power supply cooling means comprises a power supply housing formed by said ledge and enclosure, a first and second opening defined in said enclosure, and means for moving said first fluid through said power supply housing.

36. A chassis as recited in claim 35, where said means for moving comprises at least one of a plurality of fans and a plurality of blowers.

37. A chassis as recited in claim 35, wherein said first opening is defined by a plurality of perforations in a top panel of said enclosure and said second opening is defined in one of a rear panel and a front panel of said enclosure.

38. A chassis as recited in claim 35, wherein said first opening is defined by a plurality of perforations in a front panel of said enclosure and said second opening is defined in one of a rear panel and a top panel of said enclosure.

* * * * *

UNITED STATES PATENT AND TRADEMARK OFFICE
CERTIFICATE OF CORRECTION

PATENT NO.        : 7,333,330 B2                                             Page 1 of 1
APPLICATION NO.   : 11/049672
DATED             : February 19, 2008
INVENTOR(S)       : John Arthur McEwan It is certified that error appears in the above-identified patent and that said Letters Patent is hereby corrected as shown below:

Title page, item (73) Assignee, "TECHNOLOGY ADVANCED GROUP, INC." should read --TECHNOLOGY ADVANCEMENT GROUP, INC.--.

Signed and Sealed this

Twenty-seventh Day of October, 2009

David J. Kappos
*Director of the United States Patent and Trademark Office*